United States Patent [19]

Davis

[11] Patent Number: 5,930,660
[45] Date of Patent: Jul. 27, 1999

[54] METHOD FOR FABRICATING DIODE WITH IMPROVED REVERSE ENERGY CHARACTERISTICS

[75] Inventor: Harold Davis, Cork, Ireland

[73] Assignee: General Semiconductor, Inc., Melville, N.Y.

[21] Appl. No.: 08/953,670

[22] Filed: Oct. 17, 1997

[51] Int. Cl.$^6$ .................................................. H01L 21/22
[52] U.S. Cl. .......................... 438/549; 438/965; 257/496; 257/927
[58] Field of Search .................................... 438/412, 413, 438/549, 965, 978; 257/493, 496, 927

[56] References Cited

U.S. PATENT DOCUMENTS

| | | |
|---|---|---|
| 3,920,493 | 11/1975 | Kravitz . |
| 4,047,196 | 9/1977 | White et al. . |
| 4,074,293 | 2/1978 | Kravitz . |
| 4,242,690 | 12/1980 | Temple . |
| 4,667,393 | 5/1987 | Ferla et al. . |
| 4,740,477 | 4/1988 | Einthoven et al. . |
| 4,891,685 | 1/1990 | Einthoven et al. . |
| 5,150,176 | 9/1992 | Schoenberg . |

OTHER PUBLICATIONS

Control of Electric Field at the Surface of P–N Junctions R. L. Davies, member, IEEE and F.E. Gentry, senior member, IEEE No Date.

*Primary Examiner*—Charles Bowers
*Assistant Examiner*—Keith Christianson
*Attorney, Agent, or Firm*—Harold James, Esq.; Robert L. Epstein, Esq.; James & Franklin, LLP

[57] ABSTRACT

To ensure bulk breakdown when the mesa diode with a positive bevel angle is reverse biased, the diffused region is formed with thinner edge portions. This eliminates corner or edge effects which create conditions of high electric field, resulting in decreased breakdown voltage and clamping voltage levels. The edges of the surface of epitaxial region are covered with a narrow oxide layer prior to diffusion. The middle portion of the surface remains uncovered. Diffusing through the oxide results in a diffused region which is thinner along the edges of the device than in the interior region below the exposed surface portion. The oxide thickness controls the depth of the edge diffusion.

5 Claims, 5 Drawing Sheets

METHOD FOR FABRICATING DIODE WITH IMPROVED REVERSE ENERGY CHARACTERISTICS

The present invention relates to semiconductor devices and more particularly to diodes designed for use in high voltage protection circuits which have superior breakdown clamping characteristics when operated in the reverse mode and to a method of fabricating such diodes.

Avalanche rugged diodes employed in protection circuits to guard against voltage or current spikes are known in the art. Such devices are fabricated on an epitaxial substrate and preferrably provided in a mesa configuration, with a positive bevel angle. A mesa device with a positive bevel angle has a larger area on the more heavily doped side than on the side which is more lightly doped. This structure results in a reduction in the electric field with a corresponding improvement in the reverse energy characteristics.

Diodes of this type are fabricated from a P-N junction formed in semiconductor material containing a P type conductivity region and an N type conductivity region. In such a device, current flows easily in one direction but not in the other. This characteristic is the key for the use of such a device in a protection circuit.

Most P-N junctions would normally break down in the surface of the device instead of the bulk unless certain precautions, well known in the art, are taken. For most diode applications, this is not of great concern. However, as the breakdown voltage of the device increases, surface effects become more of a problem. Corner or edge effects create conditions of higher electric field, resulting in decreases in breakdown voltage and in clamping voltage.

Experience indicates that the practical cutoff for conventional diodes of this type is about 1000 V. For devices of this high voltage to sustain repeated current surges they must be robust and well manufactured with contaminations kept to a minimum.

High voltage protection diodes are typically fabricated on epitaxial wafers of either polarity to take advantage of the low resistance of the substrate. The positive bevel angle is achieved by using an epitaxially formed wafer with the substrate having an opposite conductivity type to the epitaxial layer. The effect of the bevel angle on the device electrical parameters is discussed in an article entitled "Control of the Electrical Field at Surface of PN Junction", by R. L. Davies and R. E. Gentry which appeared in IEEE Transactions in Electron Devices, July 1964, pages 313–323. Examples of patents which disclose devices where the junction is formed with the epitaxial layer are U.S. Pat. No. 4,740,477 to Einthoven et al. and U.S. Pat. No. 4,891,685 also to Einthoven et al.

Another important aspect of high voltage diode devices is that they would normally be operated in reachthrough mode. In that mode, it is base width of the device which limits the breakdown voltage and not the resistivity. The epitaxial region is fully depleted in that mode of operation.

It is the general object of the present invention to improve upon the positive bevel angle mesa diode structure by enhancing the reverse energy characteristics of the device to increase performance and reduce cost. If the clamping voltage is decreased for a given breakdown voltage, then the upper target of the breakdown voltage can be increased to give the same clamping voltage. This widens the Vz target, which increases yields and improves costs.

The same technique can be applied to Au doped rectifiers which require surge robustness. Other applications may appear to those skilled in the art, as well.

It is, therefore, a primary object of the present invention to create a high voltage protection diode with improved reverse energy characteristics.

It is another object of the present invention to create an improved performance protection diode structure which can be fabricated at reduced cost.

It is another object of the present invention to provide a method for fabricating a protection diode with improved reverse energy characteristics.

It is another object of the present invention to provide a method for fabricating a protection diode with improved reverse energy characteristics which increases yields and reduces costs.

In accordance with one aspect of the present invention, a diode is provided comprising a substrate of a given conductivity type and an epitaxial region of a conductivity type opposite that of the substrate. Interior and edge diffused regions are formed in the epitaxial region. The interior diffused region is deeper than the edge diffused region. A passivation layer is situated along the side of the device. A contact is created above the interior diffused region.

The diode has a mesa structure. The side of the diode has a positive bevel angle, proximate the edge diffused region.

As the diode is reverse biased, the depletion region spreads within the area of the epitaxial layer aligned with the edge diffused region to a greater extent than it does within the area of the epitaxial layer aligned with the interior diffused region.

The diffused regions are formed by growing an oxide layer over the epitaxial layer. A portion of the oxide layer is removed to expose the middle portion of the surface of the epitaxial region. The unit is subjected to diffusing ions. The ions diffuse to a greater depth into the epitaxial region in the areas below the exposed middle surface portion, forming the interior diffused region. The ions diffuse to a lesser depth into the epitaxial region below in the oxide covered areas, forming the edge diffused region.

The depth of diffusion in the edge diffused region is a function of the thickness of the oxide layer. Preferably, the interior diffused layer is approximately three and may be as much as five times deeper than the edge diffused region.

In accordance with another aspect of the present invention, a method for fabricating a diode on a substrate of a given conductivity type is provided. The method starts by forming an epitaxial region over the substrate which has the opposite conductivity type as the substrate. An oxide layer of a given thickeness is grown over the epitaxial region surface. The oxide layer is removed to expose a portion of the surface of the epitaxial region. Ions are diffused into the epitaxial region. The ions are of a conductivity determining type the same as that of the epitaxial region. The ions diffuse through the remaining portion of the oxide layer and into the epitaxial region to a depth less than the depth of the diffused ions in the areas of the epitaxial region below the exposed portion of the surface. The sides of the device are etched. A passivation layer is deposited over the etched sides. A metal contact is formed over the epitaxial region surface.

Preferably, the diffused region under the exposed surface portion is approximately three and possibly as much as five times as deep as the diffused regions below the oxide. The depth of the diffused ions in the portion of the epitaxial region covered by the oxide layer is a function of the thickness of the oxide. Accordingly, the reverse energy characteristics of the diode are determined, in part, by the thickness of the oxide.

To these and to such other objects which hereinafter appear, the present invention relates to a protection diode with improved reverse energy characteristics and a method for fabricating same, as set forth in detail in the following specification and recited in the annexed claims, taken together with the accompanying drawings, in which like numerals refer to like parts, and in which:

Figure 1:
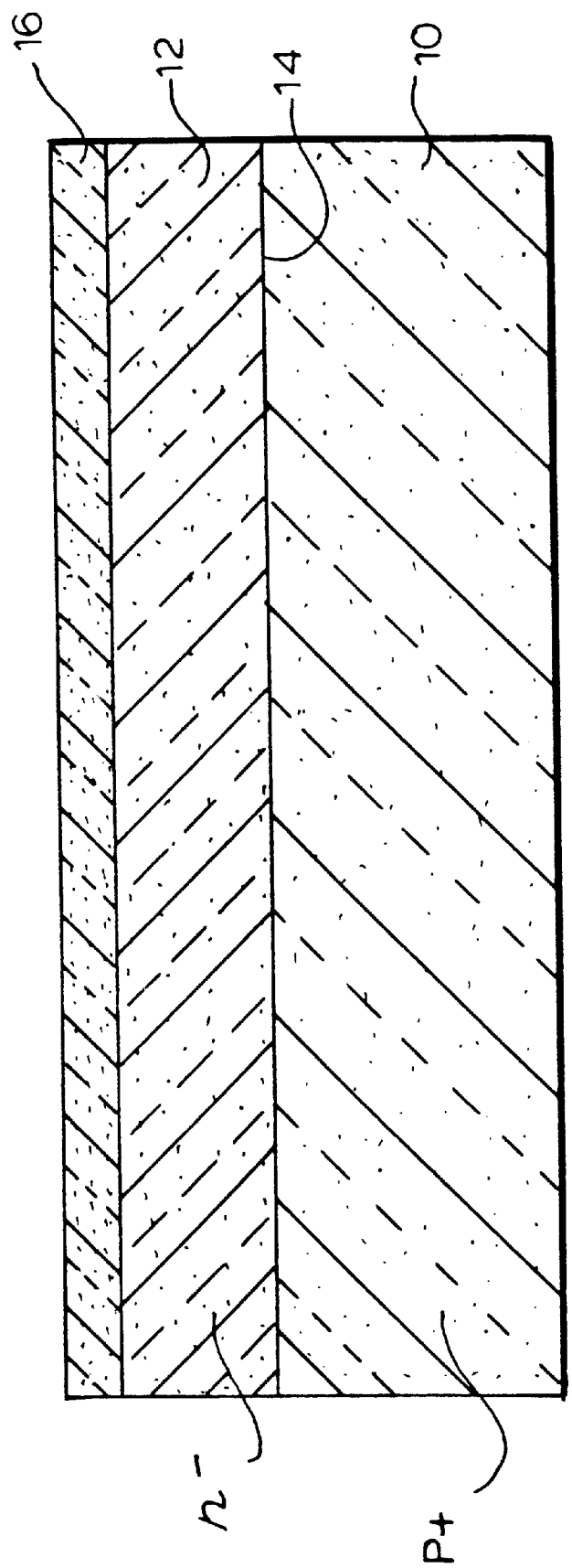
FIG. 1 is a greatly enlarged side cross-sectional view of a portion of a wafer which will become a single device, showing the substrate, the epitaxial region and the oxide layer.

As illustrated in FIG. 1, the process begins with a substrate 10 of any orientation, usually either <111> or <100> or doping, typically less than 20 mohm-cm. Substrate 10 is shown a P-type, but can be either conductivity type.

An epitaxial region 12 is formed over substrate 10. Region 12 is of the opposite conductivity type, shown here as N-type. The thickness and resistivity of region 12 are selected to control the breakdown voltage and clamping voltage characteristics by techniques well known in the art.

The boundry between substrate 10 and region 12 forms the P-N junction 14. Both orientations of region 12 are applicable. A P+ substrate could have an N- or N+ epitaxial layer 12. A N+ substrate could have either an P+ or P- epitaxial layer 12.

An oxide layer 16 is then grown or deposited over the surface of region 12. As will become evident, the thickness of the oxide layer 16 determines certain of the reverse energy characteristics of the device and is choosen with same in mind.

Figure 2:
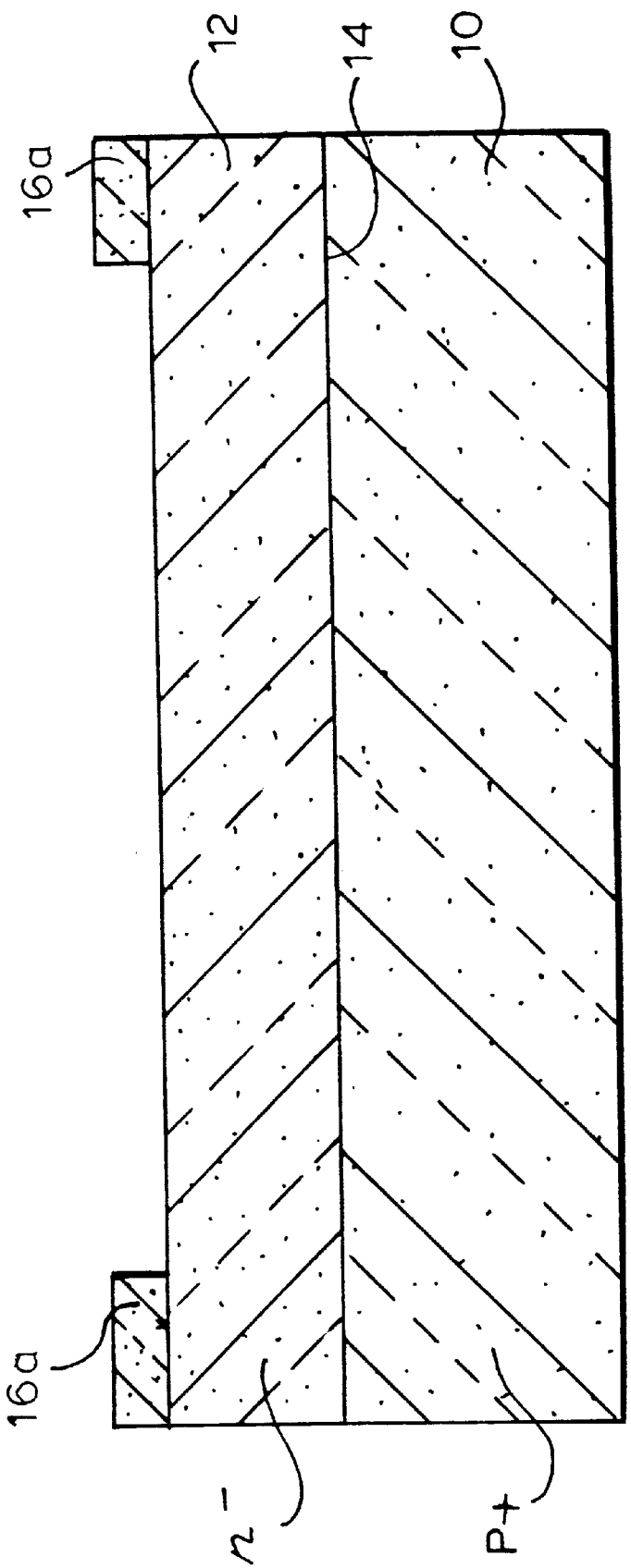
FIG. 2 is a view similar to FIG. 1, showing the wafer with a portion of the oxide layer removed.

As seen in FIG. 2, oxide layer 16 is patterned using conventional techniques of coating, masking and etching to remove areas of the oxide over the middle portion of the surface of each device, leaving only oxide portions 16a over the surface portions around the edge of the device. The oxide mask dimensions are shown as very close to the overall die size. However, those skilled in the art will appreciate that other combinations of dimensions of this mask and the subsequent moat definition mask could be utilized.

The wafer is then subjected to a phosphorus or boron diffusion, depending upon the conductivity type of the epitaxial region. Normally, phosphorous is diffused into N type epitaxial material whereas boron is used for P type material. Other dopants could be used as well.

Figure 3:
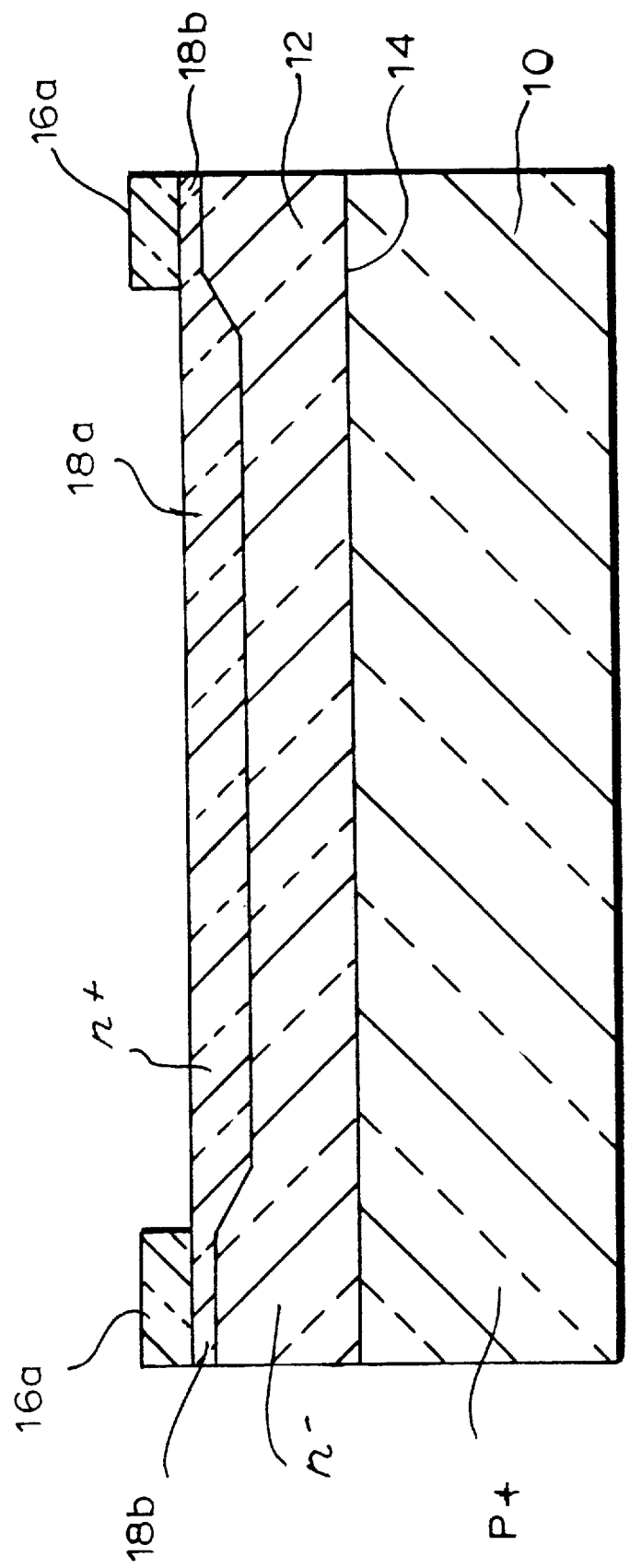
FIG. 3 is a view similar to FIG. 1, showing the wafer after diffusion.

As seen in FIG. 3, the diffusion results in a diffused region with two portions, a deeper interior region 18a aligned with the portion of the surface of epitaxial region 12 not covered by oxide and a shallower edge region 18b, formed under oxide 16a. In order to form diffused edge region 18b, the diffusing impurity must go completely through oxide 16a. The depth of diffused edge region 18b would optimally be less than one third and preferably less than one fifth of the depth of diffused interior region 18a. The depth of diffused edge region 18b is a function of the thickness of oxide 16a.

Figure 4:
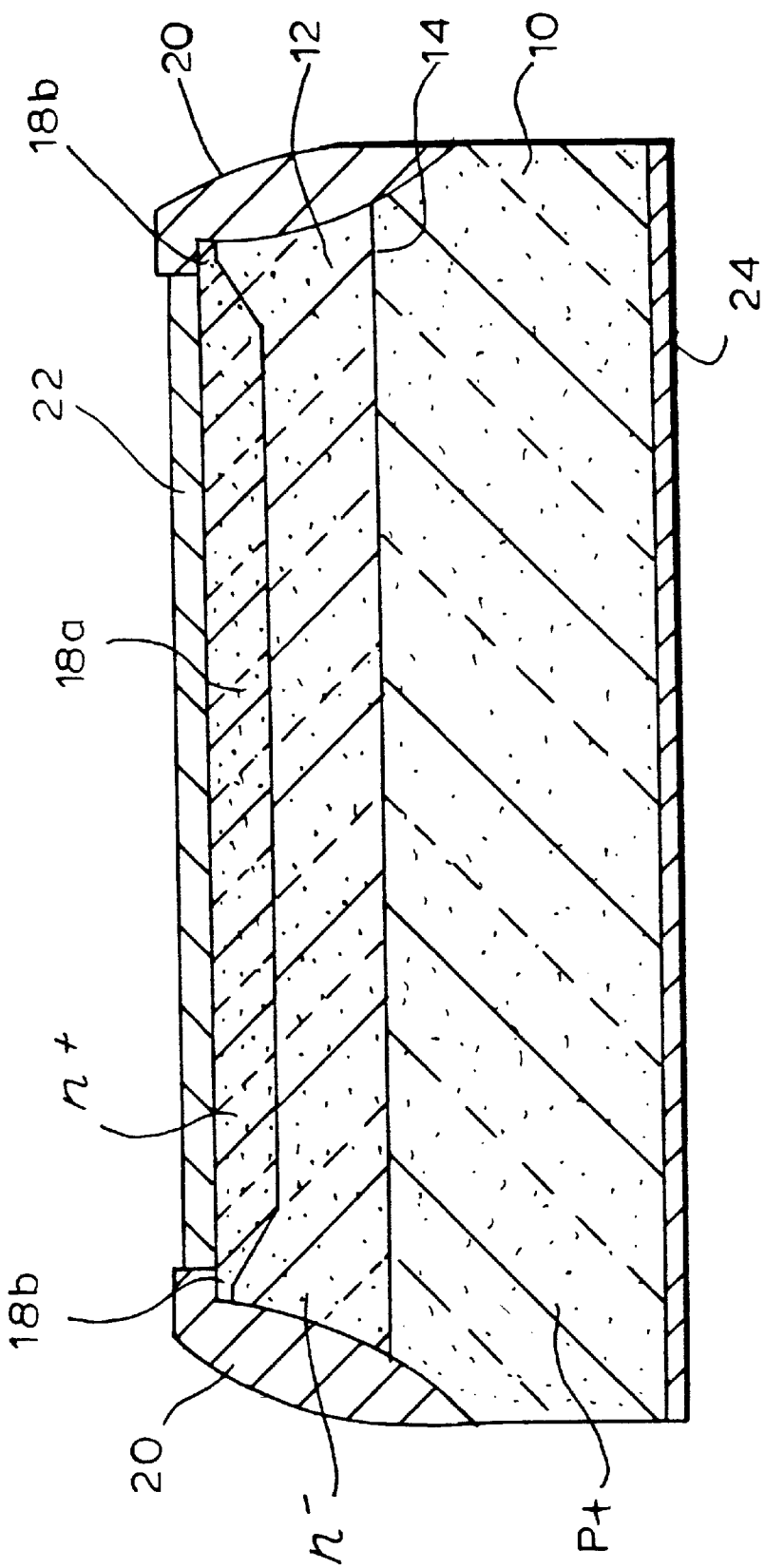
FIG. 4 is a view similar to FIG. 1, showing the wafer with the moats formed, the passivation layer deposited and the contact pattern in place.

Referring now to FIG. 4, moats are etched to define the sides of individual devices with positive bevel angles. A passivation layer 20 is then formed over the device. Typically this includes a semi-insulating layer for electric field spreading, a silicon nitride layer as a barrier against continents and a glass layer as protection against mechanical abrasion.

The passivation layer is etched from above diffused interior region 18a to form the contact pattern. Metalization layers 22, 24 are formed on the top and bottom surfaces of the wafer, respectively. Individual devices are tested and marked. The wafer is diced and packaged in a conventional manner.

Figure 5:
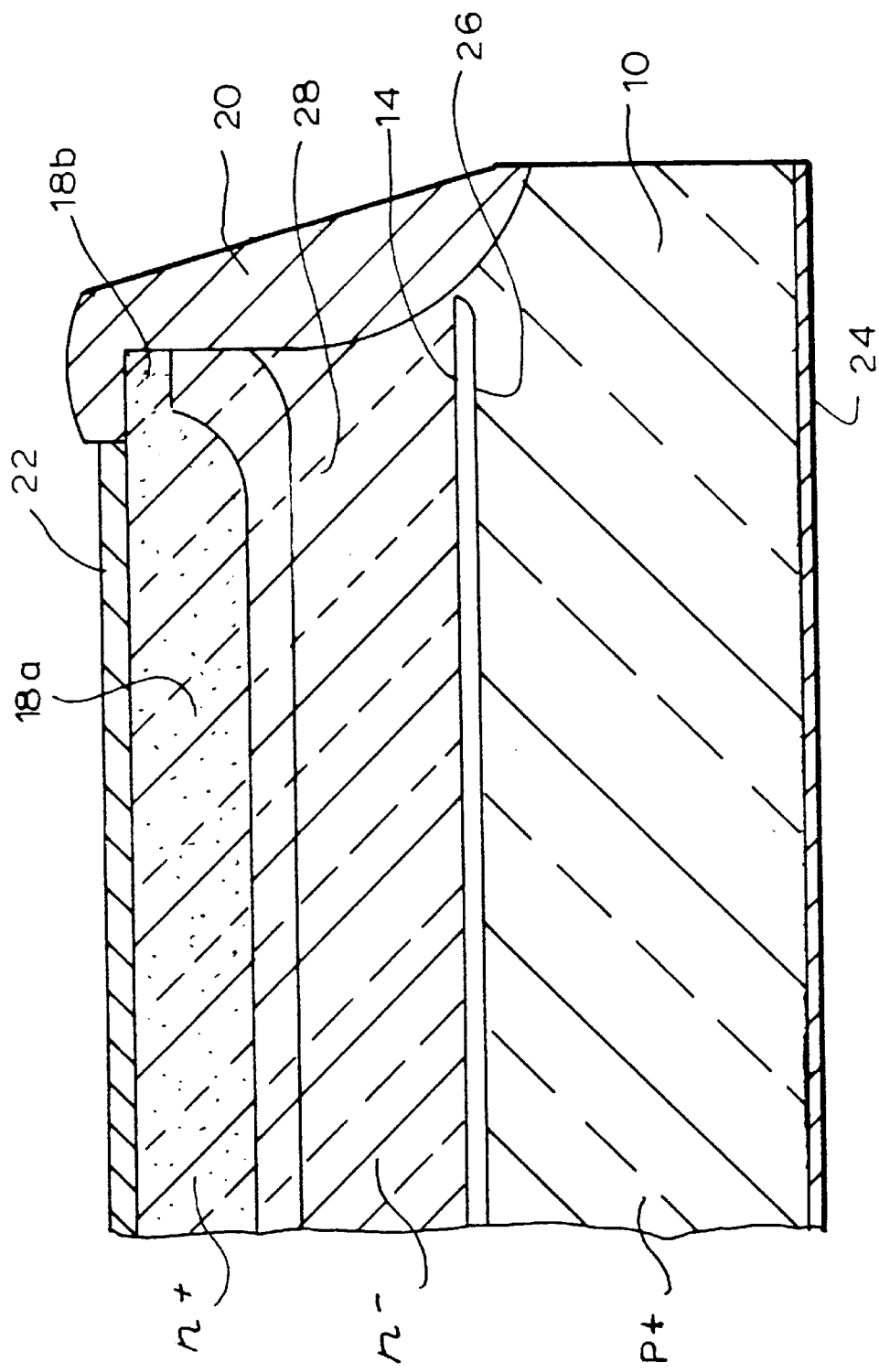
FIG. 5 is an even more enlarged cross-sectional view of a portion of a completed device, showing the depletion region boundaries as the device is operated in the reverse mode.

When the device is operated in the reverse mode, the depletion region defined between boundries 26, 28 has the shape illustrated in FIG. 5. The boundry 28 of the depletion region will reach the bottom of diffused edge region 18a before it reaches the bottom of diffused interior region 18b. This ensures bulk breakdown and eliminates surface problems, as the depletion region reaches the contact in the bulk before the contact at the surface. Superior clamping both in terms of performance and yield is the result.

While only a single preferred embodiment of the present invention has been disclosed for purposes of illustration, many variations and modifications could be made thereto. It is intended to cover all of these variations and modifications which fall within the scope of the present invention, as defined by the following claims.

I claim:

1. A method for fabricating a diode on a substrate of a given conductivity type comprising the steps of: forming an epitaxial region over the substrate, the epitaxial region having a conductivity type opposite that of substrate; growing an oxide layer of a given thickness over the epitaxial region; removing the oxide layer to expose the middle portion of the surface of the epitaxial region; diffusing ions into the epitaxial region, the diffusing ions having conductivity determining type the same as that of the epitaxial region, the ions diffusing through the remaining oxide and into the edge portion of the epitaxial region to a depth less than the depth of the diffused ions in the interior of the epitaxial region under the exposed surface portion, the diffused region formed under the exposed middle portion of the surface of the epitaxial region having a depth greater than the depth of the diffused region formed under the remaining oxide, etching a contact pattern and forming metal contacts.

2. The method of claim 1 further comprising the step of etching the side of the device to form a positive bevel angle.

3. The method of claim 2 further comprising the step of depositing a passivation layer over said side.

4. The method of claim 1 wherein the depth of diffused ions in the interior edge portion of epitaxial region is approximately three times as deep as that of the diffused ions in the edge portion of the epitaxial region.

5. The method of claim 1 wherein the depth of the diffused ions in the interior epitaxial region is approximately five times as deep as that of the diffused ions in the edge portion of the epitaxial region.

* * * * *